United States Patent [19]

Heau et al.

[11] Patent Number: 6,042,950

[45] Date of Patent: Mar. 28, 2000

[54] SURFACE COATING FOR INSULATIVE MATERIALS, METHOD OF OBTAINING IT AND ITS APPLICATION TO SHIELDING INSULATIVE CASES

[75] Inventors: Christophe Heau, Saint-Etienne; Paul Berger, Fraisses, both of France

[73] Assignee: Tecmachine, Angrezieux-Boutheon, France

[21] Appl. No.: 08/933,585

[22] Filed: Sep. 19, 1997

[30] Foreign Application Priority Data

Sep. 26, 1996 [FR] France .................................. 96 11724

[51] Int. Cl.[7] ...................................................... B32B 15/04
[52] U.S. Cl. .......................... 428/626; 428/673; 428/680; 174/35 MS
[58] Field of Search ...................... 428/624, 625, 428/626, 621, 673, 680, 438; 174/35 MS

[56] References Cited

U.S. PATENT DOCUMENTS 5,585,139  12/1996  Steininger et al. ..................... 427/128

FOREIGN PATENT DOCUMENTS

| 0 140 032 | 5/1985 | European Pat. Off. . |
| 43 22 512 | 1/1994 | Germany . |
| 44 43 530 | 6/1995 | Germany . |
| 2 270 421 | 3/1994 | United Kingdom . |
| WO 94/18003 | 8/1994 | WIPO . |
| WO 94/21099 | 9/1994 | WIPO . |

OTHER PUBLICATIONS

Abstract, JP 56 029837, Mar. 25, 1981.

*Primary Examiner*—John J. Zimmerman
*Attorney, Agent, or Firm*—Morgan & Finnegan, LLP

[57] ABSTRACT

A surface coating on an insulative material substrate, assuring protection against electromagnetic interference in corrosive environments, comprises two stacked metallic layers. The first layer, in contact with the substrate, is a layer of nickel-based alloy containing about 2% to 20% by weight of an element from group V B from the Periodic Table of the Elements. The second, surface layer is a layer of silver or one or its alloys. Applications include insulative material cases for electrical or electronic components including a shield consisting of a surface coating of this kind.

17 Claims, No Drawings

SURFACE COATING FOR INSULATIVE MATERIALS, METHOD OF OBTAINING IT AND ITS APPLICATION TO SHIELDING INSULATIVE CASES

BACKGROUND OF THE INVENTION

1. Field of the Invention

The present invention concerns an insulative material surface coating. To be more precise, the invention concerns a surface coating for insulative material parts designed to assure protection against electromagnetic interference in a corrosive environment.

Said insulative materials include polymer materials and composite materials of the type including, for example, but not exclusively, a resin based on polymer material with reinforcing fibers.

One application of the present invention is the production of electromagnetic shielding for electrical or electronic component cases made of polymer or composite materials. The invention is therefore equally concerned with such shielded polymer or composite material cases for electrical or electronic components.

Another application of the present invention is the production of a protective layer, for parts subjected to severe constraints such as corrosion, that necessitates the presence of a metal protective layer having high adhesion, regardless of the external constraints.

2. Description of the Prior Art

Industrial processes for metalizing polymer material parts, in particular the so-called "wet" process and the so-called "vacuum evaporation" process, and the application of paint charged with metal particles are already known in themselves.

The wet process generally consists in appropriately preparing the surface, including steps of satin finishing and activation, followed by depositing a layer of copper in two steps, the first using chemical conversion, the second using electrolysis.

The vacuum evaporation process, very widely used in the decorative arts, consists in applying a very thin film of metal, generally aluminum, to the part to be coated by evaporation in a vacuum. Because it is thin, this film is very fragile. For this reason it is often protected by a varnish.

In some cases, metalization is sometimes preceded by an activation treatment using an atmospheric plasma or in a vacuum.

Finally, conductive paints, consisting of resins containing metal, for example copper, aluminum, silver, etc particles are sometimes used but have high resistivities and the thickness of the coating is not controlled with great accuracy.

Technical advances and ever more demanding performance requirements means that the current solutions have reached their limits and cannot be used in many cases.

In particular, new applications of electronics are leading to the use of portable equipment in more and more varied conditions, in particular outside buildings, introducing a new constraint, namely resistance to various forms of corrosion. This phenomenon can deteriorate or even destroy the metal layer, as in the case of aluminum and copper, and can also deteriorate the interface between the polymer substrate and the metal coating leading to partial or total detachment of the latter. In both cases, the electromagnetic protection of the components is no longer assured.

An object of the present invention is to provide a surface coating which, whilst having excellent adhesion to plastics and composite materials, together with remarkable resistance to corrosion, especially saline corrosion, provides high quality protection against electromagnetic interference and the adhesion of which is not affected by exposure to a corrosive atmosphere.

The Applicant has developed a surface coating composition for an insulative material substrate satisfying the above object by assuring durable electromagnetic protection, even in corrosive atmospheres.

SUMMARY OF THE INVENTION

The invention consists in a surface coating on an insulative material substrate, adapted to assure protection against electromagnetic interference in corrosive environments, comprising two stacked metal layers, the first, in contact with said substrate, being a layer of nickel-based alloy containing about 80% to 98% by weight of nickel, the second, surface layer being a layer based on metallic silver or one of its alloys.

In one preferred embodiment of the invention, the nickel-based alloy contains at least one metal from group V B in the Periodic Table of the Elements, the most usual being vanadium, in an amount between about 2% and 20% by weight. The amount of the metal from group V B from the Periodic Table of the Elements in the nickel-based alloy is advantageously between about 5% and 10% by weight.

In a manner that has yet to be explained, the simultaneous properties of protection against electromagnetic interference, resistance to corrosion and adhesion are optimal when the nickel-based alloy layer and the metallic silver based layer have thicknesses between 0.02 $\mu$m and 1 $\mu$m and between 0.2 $\mu$m and 2 $\mu$m, respectively. These qualities can deteriorate if the thicknesses are greater than those indicated. For smaller thicknesses adhesion is excellent but resistance to corrosion and electromagnetic protection are insufficient.

The skilled person is well aware that silver-based alloys have a higher resistivity that metallic silver. Consequently, in the case of a silver-based alloy, the thickness of the layer must be multiplied by the ratio between the resistivity of said silver-based alloy and the resistivity of metallic silver.

The surface coating of the present invention is particularly advantageous and performs particularly well because, simultaneously:

it provides high quality protection against electromagnetic interference due to its excellent electrical conductivity, it has excellent adhesion to plastics and composite materials, it has excellent resistance to corrosion, especially saline corrosion, its adhesion is not affected at all by exposure to the corrosive atmosphere.

The two-layer surface coating of the invention can be applied by any appropriate surface treatment process or technology without its properties being affected thereby. However, in one preferred, but not exclusive, embodiment the coating of the invention is applied by a vacuum deposition technology, the best results being obtained with the cathode sputtering technique.

The surface coatings of the present invention have one application in shielding cases of electrical or electronic components, in particular cases of portable telephones.

DETAILED DESCRIPTION OF THE INVENTION

The non-limiting examples described hereinafter illustrate the invention.

EXAMPLES

In all the following examples, polymer test pieces were coated. The surface resistivity R☐, also known as the resistance per unit area, and representative of the protection against electromagnetic interference, was measured first and the adhesion of the coating was assessed using the standard pull-off test involving application of an adhesive tape after criss-cross scoring. The test pieces were then subjected for 48 hours to the accelerated corrosion test known as the "salt spray" test, carried out in accordance with French standard NF C 20-711. After washing and drying them, the test pieces were again subjected to the surface resistivity and adhesion tests, using the pull-off test of French standard NF T 30-038; the final result indicated the level of protection assured by the coating and its durability.

Example 1

(Comparative)

A 3 μm thick layer of aluminum was deposited on a batch of five test pieces by oxygen plasma activation followed by vacuum evaporation deposition.

Before the corrosion test, the mean resistivity R☐ was 60 mΩ☐. The adhesion was excellent (no pull-off in the traction test). After exposure to the salt spray, the resistivity R☐ was 150 mΩ☐ at the measurement points, confirmed by visual observation: the coating had been converted, at least on the surface, into insulative alumina, with a greater or lesser degree of hydration. At the same time, adhesion had become very weak, the coating pulling off easily on the adhesive tape.

Example 2

(Comparative)

A 5 μm thick deposit of copper was applied to a second batch of five test pieces by a conventional aqueous phase technique: satin finishing, activation, chemical copper plating, electrolytic copper plating.

Before the corrosion test, the mean resistivity R☐ was 10 mΩ☐ and the adhesion was excellent.

After exposure to the salt spray, the appearance of the coating indicated the abundant presence of verdigris, the resistivity R☐ was between 20 mΩ☐ and 80 mΩ☐ and the adhesion could not be measured because of partial separation and flaking of the coating at many points on the test pieces.

Example 3

(Comparative)

A conductive paint sold by BECKER INDUSTRIE under reference 599-Y 2000 was applied to a third batch of test pieces and then polymerized in accordance with the recommendations of the manufacturer. The mean thickness of the film was 35 μm±10 μm.

Before the corrosion test, the mean resistivity R☐ was 50 mΩ☐ and adhesion was excellent as the traction test did not cause any pulling off. After corrosion, the appearance of the coating had changed little and the resistivity R☐ was between 320 mΩ☐ and 450 mΩ☐. Adhesion was partly degraded as the test showed pull-off at a few points.

Example 4

A fourth batch of 15 test pieces was divided into three groups A, B and C each of five test pieces. Each batch then received a first layer of nickel alloy including 8% vanadium (layer in contact with the substrate) followed by a layer of metallic silver (surface layer), the two layers being deposited successively by cathode sputtering in a vacuum.

The respective thicknesses of the layers deposited on the test pieces of the three groups were as listed in Table 1 below:

TABLE 1

| Group | Ni-based alloy | Metallic silver |
|-------|----------------|-----------------|
| A     | 0.02 μm        | 0.2 μm          |
| B     | 0.1 μm         | 0.7 μm          |
| C     | 0.5 μm         | 1.8 μm          |

The results of the surface resistivity and adhesion tests before and after corrosion are set out in Table 2 below:

TABLE 2

| | Before corrosion | | After corrosion | |
|---|---|---|---|---|
| Group | R☐(± 5 mΩ☐) | Adhesion | R☐(± 5 mΩ☐) | Adhesion |
| A | 260 mΩ☐ | no pull-off | 260 mΩ☐ | no pull-off |
| B | 80 mΩ☐ | no pull-off | 80 mΩ☐ | no pull-off |
| C | 35 mΩ☐ | a few places | 35 mΩ☐ | a few places |

Note that none of the test pieces from the three groups had changed in appearance after corrosion. Adhesion was excellent as the test showed no pull-off points for groups A and B and only a few pull-off points for group C, where the thickness of the coating, probably too great, had not produced an interface of perfect quality. The resistivity R☐ was remarkably stable. The very low values of R☐ measured for groups B and C indicated an excellent level of protection; the values of R☐ measured for group A, although acceptable, represented a slightly lower level of performance, probably associated with the small thickness of the layers.

The person skilled in the art will understand that although the invention has been described and shown by specific embodiment, many variants can be envisaged without departing from the scope of the invention as defined in the accompanying claims.

There is claimed:

1. A surface coating on an insulative material substrate, adapted to a protection against electromagnetic interference in corrosive environments, comprising two stacked metal layers, the first, in contact with said substrate, being a layer of nickel-based alloy containing about 80% to 98% by weight of nickel, and between about 2% and 20% by weight of at least one metal from group V B of the Periodic Table of the Elements, the second, surface layer being a layer based on metallic silver or one of its alloys.

2. The surface coating claimed in claim 1 wherein the concentration in the nickel-based alloy of said element from Group VB from the Periodic Table of the Element is between about 5% and 10% by weight.

3. The surface coating claimed in claim 1 wherein said element from Group VB of the Periodic Table of the Elements is vanadium.

4. The surface coating claimed in claim 1 wherein the thickness of said nickel-based alloy layer is between 0.02 μm and 1 μm.

5. The surface coating claimed in claim 1 wherein said surface layer is of metallic silver and the thickness of said layer based on metallic silver is between 0.2 µm and 2 µm.

6. The surface coating claimed in claim 1 wherein said surface layer is a silver-based alloy and the thickness of said silver alloy-based layer is between n×0.2 µm and n×2 µm where "n" is the value of the ratio between the resistivity of said silver-based alloy and the resistivity of the metallic silver.

7. The surface coating claimed in claim 1 wherein said insulative material is chosen from polymer materials and composite materials.

8. The surface coating claimed in claim 7 wherein said composite material comprises a polymer and reinforcing fibers.

9. The surface coating claimed in claim 1 wherein said nickel-based alloy layers and said silver-based surface layer are applied by a vacuum deposition technology.

10. The surface coating claimed in claim 9 wherein said vacuum deposition technology is cathode sputtering.

11. A shielded insulative material case for electrical or electronic components wherein the shield is a surface coating as claimed in claims 1, 2, 3, 4, 5, 6, 7, 8, 9 or 10.

12. A surface coating on an insulative material substrate, adapted to assure protection against electromagnetic interference in corrosive environments, comprising two stacked metal layers, the first, in contact with said substrate, being a layer of nickel-based alloy containing 80% to 98% by weight of nickel, said nickel based alloy containing between about 2% and 20% by weight of at least one metal from group V B of the Periodic Table of the Elements the second, surface layer being a layer based on metallic silver or one of its alloys, the surface resistivity of said surface coating capable of remaining stable when said surface coating is subjected for 48 hours to an accelerated corrosion test, carried out in accordance with French standard NF C 20-711.

13. The surface coating claimed in claim 12 wherein the concentration in the nickel-based alloy of said element from group V B from the Periodic Table of the Elements is between about 5% and 10% by weight.

14. The surface coating claimed in claim 12 wherein said element from group VB from the Periodic Table of the Elements is vanadium.

15. The surface coating claimed in claim 12 wherein the thickness of said nickel-based alloy layer is between 0.02 µm and 1 µm.

16. The surface coating claimed in claim 12 wherein said surface layer is of metallic silver and the thickness of said layer based on metallic silver is between 0.2 µm and 2 µm.

17. The surface coating claimed in claim 12 wherein said resistivity is between 35 and 260 mΩ.

* * * * *